United States Patent

[11] 3,618,075

[72] Inventor Akira Kaida
Tokyo, Japan
[21] Appl. No. 749,217
[22] Filed July 31, 1968
[45] Patented Nov. 2, 1971
[73] Assignee Sakura Sokki Kabushikikaisha
Tokyo, Japan
[32] Priority Sept. 7, 1967
[33] Japan
[31] 42/76811

[54] ANALOG-DIGITAL CONVERTER
2 Claims, 5 Drawing Figs.

[52] U.S. Cl. .......... 340/347 AD
[51] Int. Cl. .......... H03k 13/20, G08c 9/04
[50] Field of Search .......... 340/347

[56] References Cited

UNITED STATES PATENTS

| | | | |
|---|---|---|---|
| 2,931,023 | 3/1960 | Quade | 340/347 |
| 2,966,300 | 12/1960 | Dickinson | 340/347 X |
| 2,987,717 | 6/1961 | Altonji et al. | 340/347 |
| 3,051,943 | 8/1962 | Simon et al. | 340/347 |
| 3,092,718 | 6/1963 | Wullert | 235/154 |
| 3,099,830 | 7/1963 | Wayman | 340/347 |
| 3,195,120 | 7/1965 | Lazecki | 340/347 X |
| 3,231,882 | 1/1966 | DeNeergaard | 340/347 X |
| 3,251,054 | 5/1966 | Simon | 340/347 |
| 3,255,448 | 6/1966 | Sadvary et al. | 340/347 |

*Primary Examiner*—Maynard R. Wilbur
*Assistant Examiner*—Gary R. Edwards
*Attorney*—Hill, Sherman, Meroni, Gross & Simpson

ABSTRACT: An analog-digital converter having a magnetic core, a plurality of windings wound on said magnetic core, said magnetic core being supplied with a multiphase alternating current to generate a rotating magnetic field, a magnetic path member disposed in opposite but spaced relation to said magnetic core and rotated in accordance with analog information, a detecting means for producing a pulse when said rotating magnetic field becomes aligned with said magnetic path member means for producing a reference pulse, and means for detecting the time difference between said pulse and reference pulse to convert analog information into digital information.

INVENTOR
Akira Kaida

BY Hill, Sherman, Meroni, Gross & Simpson ATTORNEYS

INVENTOR
Akira Kaida

BY Hill, Sherman, Meroni, Gross & Simpson ATTORNEYS

INVENTOR.
Akira Kaida

BY Hill, Sherman, Meroni, Gross & Simpson ATTORNEYS

ANALOG-DIGITAL CONVERTER

BACKGROUND OF THE INVENTION

1. Field of the Invention

This invention relates to an analog-digital converter, and more particularly to a novel brushless analog-digital converter utilizing a rotating magnetic field.

2. Description of the Prior Art

In general, analog-digital converters for translating analog information such as mechanical rotational angle or the like into digital form are classified into two types: a code system and a pulse-counter system, and these types are each divided into those employing a brush and those without it.

In the aforementioned analog-digital converters of the type employing a brush, the use of the brush inevitably generates friction with a code plate to increase operating torque and the constant contact of the brush with the code plate causes abrasion therein to lower the durability thereof and results in bad contact therebetween, all of which introduce many drawbacks such as deterioration of the characteristics of the converters, for example, errors in measurements.

While, in the brushless analog-digital converters signals are generally picked up by means of a photoelectric element, permanent magnet and oscillation coil but this type of converters presents problems such as the variations in the quantity of light emanating from a lamp employed and breakage of wire in the case of the photoelectric element and a decrease in the magnetic force of the magnet due to its secular variation in the case of the permanent magnet.

Further, these prior art converters employ a synchronous motor for scanning but such mechanical means yields inertia in itself, which naturally imposes a severe limitation on the shortening of the time for the scanning and hence does not permit rapid analog-digital conversion.

In addition, the use of such a moving member is not preferred, since it raises problems such as poor durability, lowered precision due to friction of the moving member, and increased manufacturing cost.

SUMMARY OF THE INVENTION

This invention resides in the provision of a novel analog-digital converter which is free from the aforementioned drawbacks encountered in the prior art and is designed to translate analog information into digital form without employing a brush, synchronous motor or the like.

Objects, features and advantages of this invention will become apparent from the following description taken in conjunction with the accompanying drawings.

DESCRIPTION OF THE PREFERRED EMBODIMENT

Figure 1:
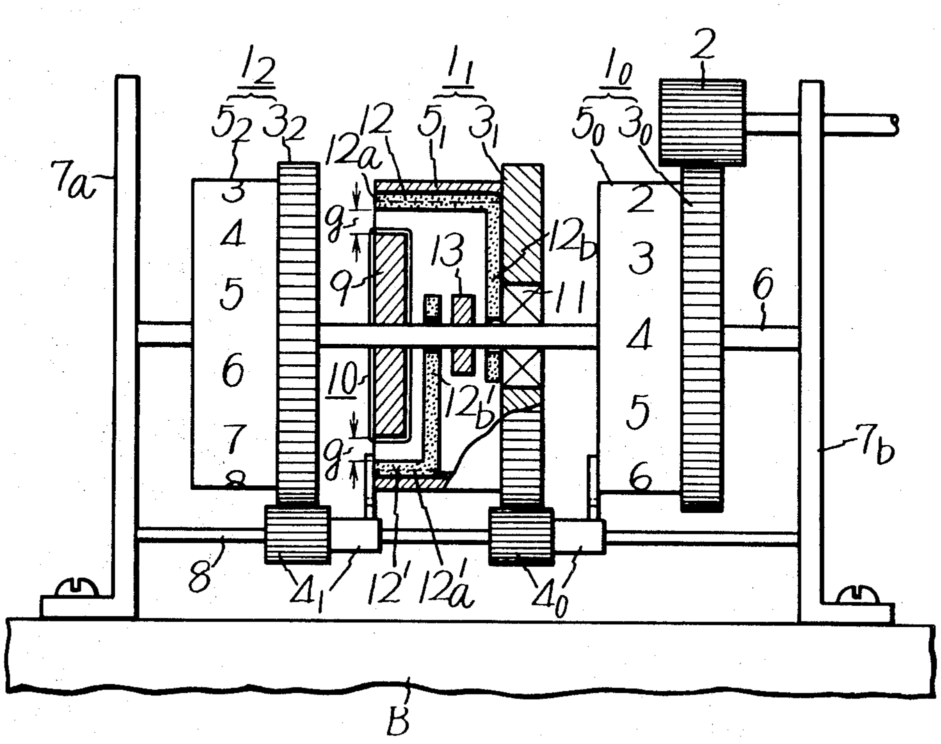
FIG. 1 is a side view, partly cut away, illustrating one example of an analog-digital converter of this invention.

With reference to the drawings an analog-digital converter of this invention will hereinafter be described by way of example. In FIG. 1 there is illustrated one example of this invention in which a number of three units is to be displayed and accordingly an indicator having three number display gears $1_0$, $1_1$ and $1_2$ is shown. Each of the number display gears $1_0$, $1_1$ and $1_2$ consists of a gear $3_0$, $3_1$ or $3_2$ and a number display cylindrical member $5_0$, $5_1$ or $5_2$ affixed to the gear. The analog-digital converter is adapted such that a number displayed by the number display gears $1_0$, $1_1$ and $1_2$ can be detected, for example, at a remote place and that a pinion 2 designed to be rotated according to analog information meshes with the gear $3_0$ of the number display gear $1_0$ displaying a numeral of $10^0$ unit to rotate it. In this case, helical gears $4_0$ are provided by means of which the gear $3_1$ of the number display gear $1_1$ displaying a numeral of $10^1$ unit is caused to turn one pitch, that is, through an angle corresponding to the interval between adjacent two numerals in accordance with the rotation of the number display gear $1_0$ to alter its display from 9 to 0. The relationships of the gears $3_0$, $3_1$, $3_2$, $4_0$ and $4_1$ are well known in the art and are not directly related to this invention, so that no detailed description will be given in this specification.

The cylindrical members $5_0$, $5_1$ and $5_2$ respectively affixed to the side of the gears $3_0$, $3_1$ and $3_2$ of the number display gears $1_0$, $1_1$ and $1_2$ are formed of a nonmagnetic material, for example, bakelite, and the numerals are provided on the peripheral surfaces of the cylindrical members 5. Reference numeral 6 indicates a fixed shaft which has rotatably mounted thereon the number display gears $1_0$, $1_1$ and $1_2$ and is extended between a pair of supports 7*a* and 7*b* fixedly planted on a baseplate B. Reference numeral 11 designates bearings through which the gears are rotatably mounted on the fixed shaft 6. Reference numeral 8 identifies a fixed shaft which has rotatably mounted thereon the helical gears $4_0$ and $4_1$ and is held between the supports 7*a* and 7*b* in the same manner as the shaft 6. The analog-digital converter of this invention is attached to each of these number display gears $1_0$, $1_1$ and $1_2$ and a description will be given in connection with the case where the converter is attached to the number display gear $1_1$ for displaying a numeral of $10^1$ unit.

In the present invention the fixed shaft 6 is formed of a nonmagnetic material, on which is mounted a disc-shaped magnetic core 9 formed of a magnetic material, for example, silicon steel. On the magnetic core 9 there are wound a plurality of, for instance, three coils 10*a*, 10*b* and 10*c* on diameters of the core 9 substantially equiangular about its center to provide a three-phase winding, which is supplied with a multiphase alternating current, (a three-phase alternating current in the illustrated example, refer to FIG. 5). In this case the magnetic core 9 is disposed, for example, in the cylindrical member 5 in spaced relation thereto. While, substantially L-shaped yokes 12 and 12′ formed of a magnetic material such, for example, as a ferromagnetic material are provided opposite the magnetic core 9. That is, the one L-shaped yoke 12 is secured to the gear 3 and the cylindrical member 5 in such a manner that its one arm 12*a* lies substantially parallel with the shaft 6 inside of the cylindrical member 5 and the other arm 12*b* runs centrally of the gear 3 on the inside thereof. Meanwhile, the other L-shaped yoke 12′ is fastened to the inside of the cylindrical member 5 with its one arm 12*a*′ lying substantially parallel with the shaft 6 inside of the cylindrical member 5 and with the other arm 12*b*′ crossing the shaft 6. In this case the yokes 12 and 12′ are arranged so that the arms 12*b* and 12*b*′ lie in aligned but spaced relation to each other and that the arm 12*b*′ and the magnetic core 9 are spaced from each other. Further, the peripheral surface of the magnetic core 9 is spaced a little from the arms 12*a* and 12*a*′, thus forming a magnetic path with the magnetic core 9 and the yokes 12 and 12′.

In addition, a detecting means 13 such as a magnetosensitive element or a coil is affixed to the shaft 6 inside the cylindrical member 5, by the impedance variation of which an output (pulse) is picked up when the magnetic flux flowing through the magnetic path has been inverted. The magnetosensitive element 13 is disposed on the shaft 6 between the arms 12*b* and 12*b*′ of the yokes 12 and 12′ in opposing and spaced relation thereto.

Figure 2:
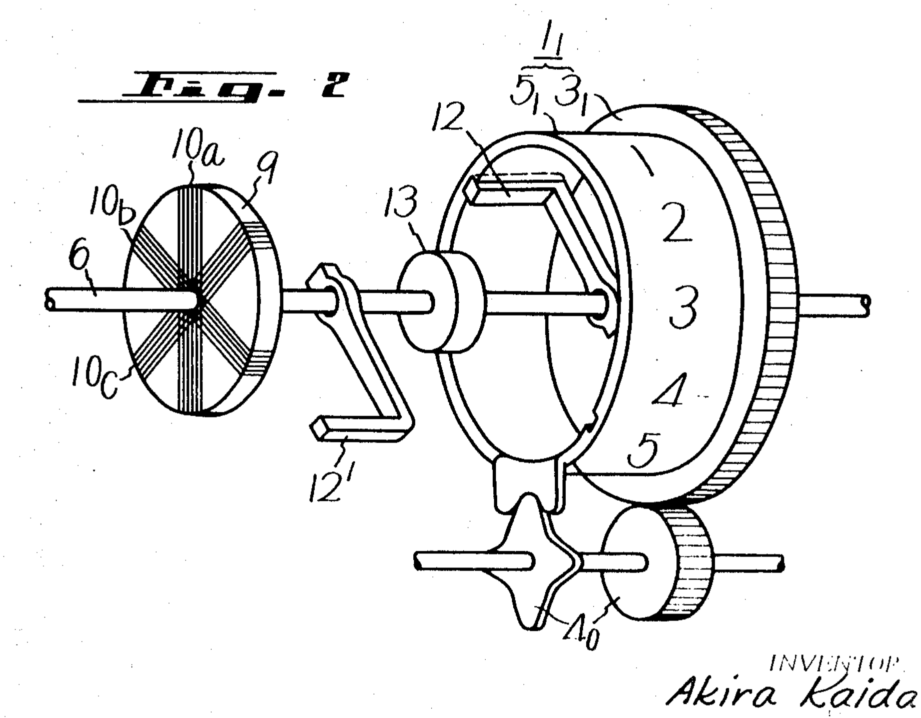
FIG. 2 is a perspective view, partly exploded, of one portion of the converter exemplified in FIG. 1.
Figure 3:
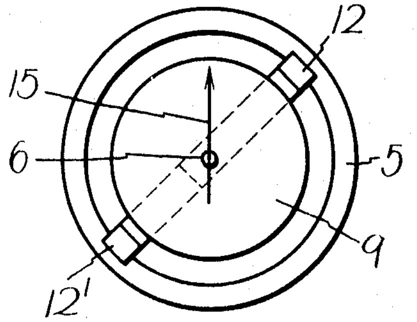
FIG. 3 is a schematic front view of one part of the converter, for explaining the operation thereof.
Figure 4:
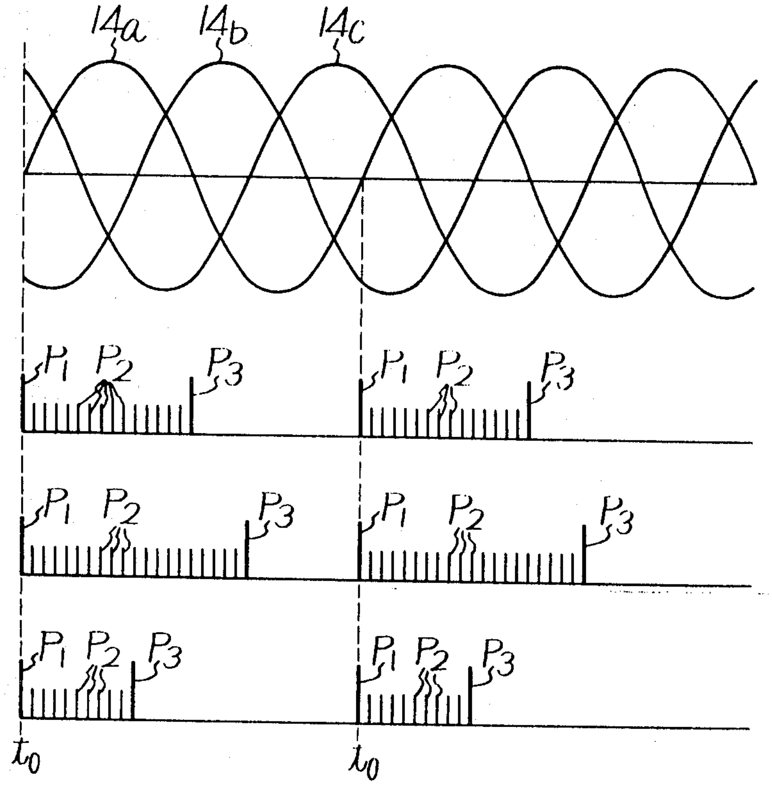
FIG. 4 is a waveform diagram, for explaining the operation of the converter.

The aforementioned three-phase winding consisting of the coils 10*a*, 10*b* and 10*c* are supplied with a three-phase alternating current made up with those indicated by 14*a*, 14*b* and 14*c* in FIG. 4, which are respectively phased 120° apart, to thereby produce a rotating magnetic field 15 rotating about the fixed shaft 6 relative to the magnetic core 9 as indicated by the arrow in FIG. 3, and the magnetosensitive element 13 generates a pulse $P_3$ such as depicted in FIG. 4 at a time when the rotating magnetic field 15 is in alignment with the yokes 12 and 12'. Further, a pulse is directly picked up from the power source in known manner at a time when one of the currents, for example, 14*a* crosses the abscissa in FIG. 4, namely at its zero potential at which the current varies from negative to positive, and the picked-up pulse will hereinafter be referred to as a reference pulse $p_1$, as depicted in FIG. 4. The reference pulse $P_1$ may be picked up through the use of another set of a cylindrical member having secured thereto yokes such as shown in FIGS. 1 and 2 and affixed to the shaft 6, a magnetic core having wound thereon a winding such as depicted in FIGS. 2 and 3 and mounted on the shaft 6 in the same manner as in the figures and a magnetosensitive element also affixed to the shaft in a similar manner to that in the figures, in which case the pulse $P_1$ is picked up from the magnetosensitive element when the rotating magnetic field produced in the magnetic core is in alignment with the yokes. It is a manner of course that the reference pulse $P_1$ may similarly be obtained by the use of a coil in place of the magnetosensitive element. Further, it is also possible to employ a magnetic core instead of the aforementioned yokes and magnetosensitive element or coil, in which case the head is positioned opposite the core 9 to detect the rotating magnetic field to produce a pulse serving as the reference pulse $P_1$. The revolving period of the aforementioned rotating magnetic field 15 may be selected at will, for example, one-fifth second.

Figure 5:
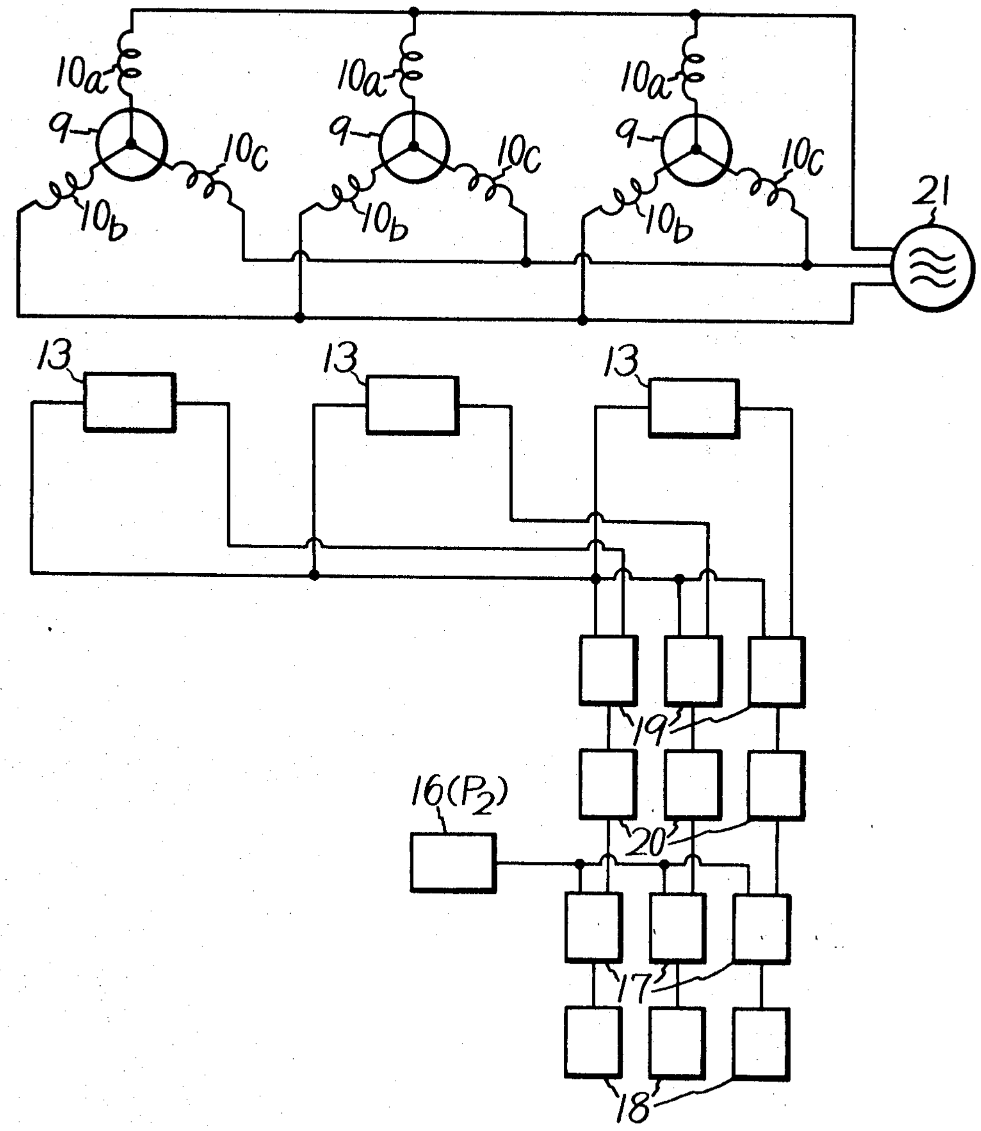
FIG. 5 is an electric circuit diagram for use with the converter shown in FIG. 1.

As illustrated in FIG. 5, there are provided a signal generator, for example, a frequency generator 16 for repeatedly generating a signal, for instance, a pulse $P_2$ at certain intervals such as shown in FIG. 4, a gate circuit 17 and a counter 18 for counting the pulse $P_2$ emanating from the frequency generator 16 through the gate circuit 17. The gate circuit 17 is opened or closed by the reference pulse $P_1$ and when the rotating magnetic field 15 becomes aligned with the yokes 12 and 12' the pulse $P_3$ is picked up from the aforementioned detecting means 13 as set forth above, by which pulse the gate circuit 17 is closed or opened. The number of the pulse $P_2$ emanating from the frequency generator 16 and passing through the gate circuit 17 remaining open is counted by the counter 18 to detect a rotational angle of the gear 1 including the magnetic path members 12 and 12' relative to its reference position, that is, the rotational angular position of the number display gear. In FIG. 5 similar elements to those in FIGS. 1 and 2 are identified by the similar reference numerals. Reference numeral 19 designates a waveform shaping-amplifying circuit, 20 a trigger circuit and 21 a three-phase AC power source. In the case where the signal from the detecting means 13 is counted at a remote location, a flip-flop circuit is connected to the stage following the waveform shaping-amplifying circuit 19, the output of which is transmitted to the remote place and is received by a flip-flop circuit provided there and its output is applied to the gate circuit 17 mentioned above.

With such an arrangement as has been described in the foregoing, when the rotating magnetic field 15 depicted in FIG. 3 is in alignment with the yokes 12 and 12' of the number display gear a magnetic flux is produced in the yokes 12 and 12', which flux is detected by the detecting means 13 and is then converted into the pulse $P_3$. Consequently, the rotational angle of the number display gear from its reference position at which the pulse $P_1$ is obtained, to the position at which the yokes 12 and 12' are provided is proportional to the number of the pulse $P_2$ from the pulse oscillator 16 passing through the gate circuit during the interval between the pulses $P_1$ and $P_3$. In other words, the aforementioned rotational angle can be measured by counting the number of the pulse $P_2$ passing through the gate circuit during the interval between the pulses $P_1$ and $P_3$ through the use of the counter. That is, the rotational angles of the number display gears in analog form can be translated in digital form.

The present invention does not employ a brush as described above and hence is free from the various disadvantages experienced in the prior art. Further, since the rotating magnetic field is utilized, there is no need of using the photoelectric element, permanent magnet or the like and accordingly this invention eliminates the drawbacks referred to at the beginning of this specification. Thus, the analog-digital converter of this invention has many advantages such as excellent precision and sensitivity, compactness in construction and low cost.

It will be apparent that many modifications and variations may be effected without departing from the scope of the novel concepts of this invention.

I claim as my invention:

1. An analog-digital converter comprising a magnetic core, a plurality of windings wound on the magnetic core and angularly spaced relative to each other, an electric power source for supplying a multiphase alternating current to the plurality of windings to generate a rotating magnetic field in the magnetic core, a pair of magnetic path members supported so as to rotate in accordance with analog information and spaced in a magnetic relationship with said magnetic core so that they are magnetically coupled to said core on opposite sides thereof, said pair of magnetic path members spaced laterally apart from each other, detecting means supported in the space between said pair of magnetic path members such that relative motion can occur between the magnetic path member and said detecting means, and detecting the pulse when the rotating magnetic field passes through the magnetic path members, means for producing a reference pulse and means for detecting the time difference between the pulse produced by said detecting means and the reference pulse to convert the analog information into digital form.

2. An analog-digital converter according to claim 1 wherein said pair of magnetic path members are generally L-shaped and having first legs supported on opposite sides of said magnetic core and having second legs which are generally aligned but spaced from each other with said detecting means mounted therebetween.

* * * * *